(12) United States Patent
Matsushima et al.

(10) Patent No.: US 12,230,643 B2
(45) Date of Patent: Feb. 18, 2025

(54) DISPLAY DEVICE

(71) Applicant: Japan Display Inc., Tokyo (JP)

(72) Inventors: Toshiharu Matsushima, Tokyo (JP); Shunichi Kimura, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 185 days.

(21) Appl. No.: 18/186,976

(22) Filed: Mar. 21, 2023

(65) Prior Publication Data

US 2023/0307463 A1  Sep. 28, 2023

(30) Foreign Application Priority Data

Mar. 22, 2022  (JP) ................. 2022-045781

(51) Int. Cl.
*G02F 1/1343* (2006.01)
*G02F 1/1362* (2006.01)
*H01L 27/12* (2006.01)

(52) U.S. Cl.
CPC ...... *H01L 27/124* (2013.01); *G02F 1/134309* (2013.01); *G02F 1/136286* (2013.01)

(58) Field of Classification Search
CPC .................................................. G02F 1/1343
See application file for complete search history.

(56) References Cited

U.S. PATENT DOCUMENTS

| 2009/0059110 | A1* | 3/2009 | Sasaki | G02F 1/133512 |
| | | | | 349/114 |
| 2018/0203306 | A1* | 7/2018 | Matsushima | G02F 1/134336 |
| 2020/0218122 | A1* | 7/2020 | Yeh | G02F 1/134309 |
| 2022/0197096 | A1* | 6/2022 | Matsushima | G02F 1/133512 |
| 2023/0408874 | A1* | 12/2023 | Kimura | G02F 1/134372 |

FOREIGN PATENT DOCUMENTS

JP    2018-116184 A    7/2018

* cited by examiner

*Primary Examiner* — Sang V Nguyen
(74) *Attorney, Agent, or Firm* — XSENSUS LLP

(57) ABSTRACT

According to one embodiment, a display device includes scanning lines, signal lines, pixels, a pixel electrode, a common electrode including a stem portion and branch portions, and a third wiring line, wherein a region where each pixel electrode and the first scanning line overlap is larger than a region where the respective pixel electrode and the second scanning line overlap, a width of the first region of the third wiring lines is less than a width of the scanning lines, and the branch portions of the common electrode extend from the stem portion along the second direction.

20 Claims, 15 Drawing Sheets

DISPLAY DEVICE

CROSS-REFERENCE TO RELATED APPLICATIONS

This application is based upon and claims the benefit of priority from Japanese Patent Application No. 2022-045781 filed Mar. 22, 2022, the entire contents of which are incorporated herein by reference.

FIELD

Embodiments described herein relate generally to a display device.

BACKGROUND

As one example of display devices, liquid crystal displays of an in-plane-switching (IPS) mode are known. In the IPS mode liquid crystal displays, pixel electrodes and a common electrode are provided on one of a pair of substrates opposing each other via a liquid crystal layer, and alignment of liquid crystal molecules in the liquid crystal layer is controlled by utilizing a lateral electric field generated between these electrodes. Further, of the IPS mode, fringe field switching (FFS) mode liquid crystal devices, in which pixel electrodes and a common electrode are disposed in different layers, have been put to practical use. In such a liquid crystal display, the alignment of liquid crystal molecules is controlled by utilizing a fringe electric field generated between a pair of electrodes.

On the other hand, there are liquid crystal display devices in which the response speed is accelerated by periodically forming regions where the liquid crystal molecules do not spin in each pixel. The configuration of liquid crystal displays of this type is hereinafter referred to as a fast response mode.

DETAILED DESCRIPTION

Figure 1:
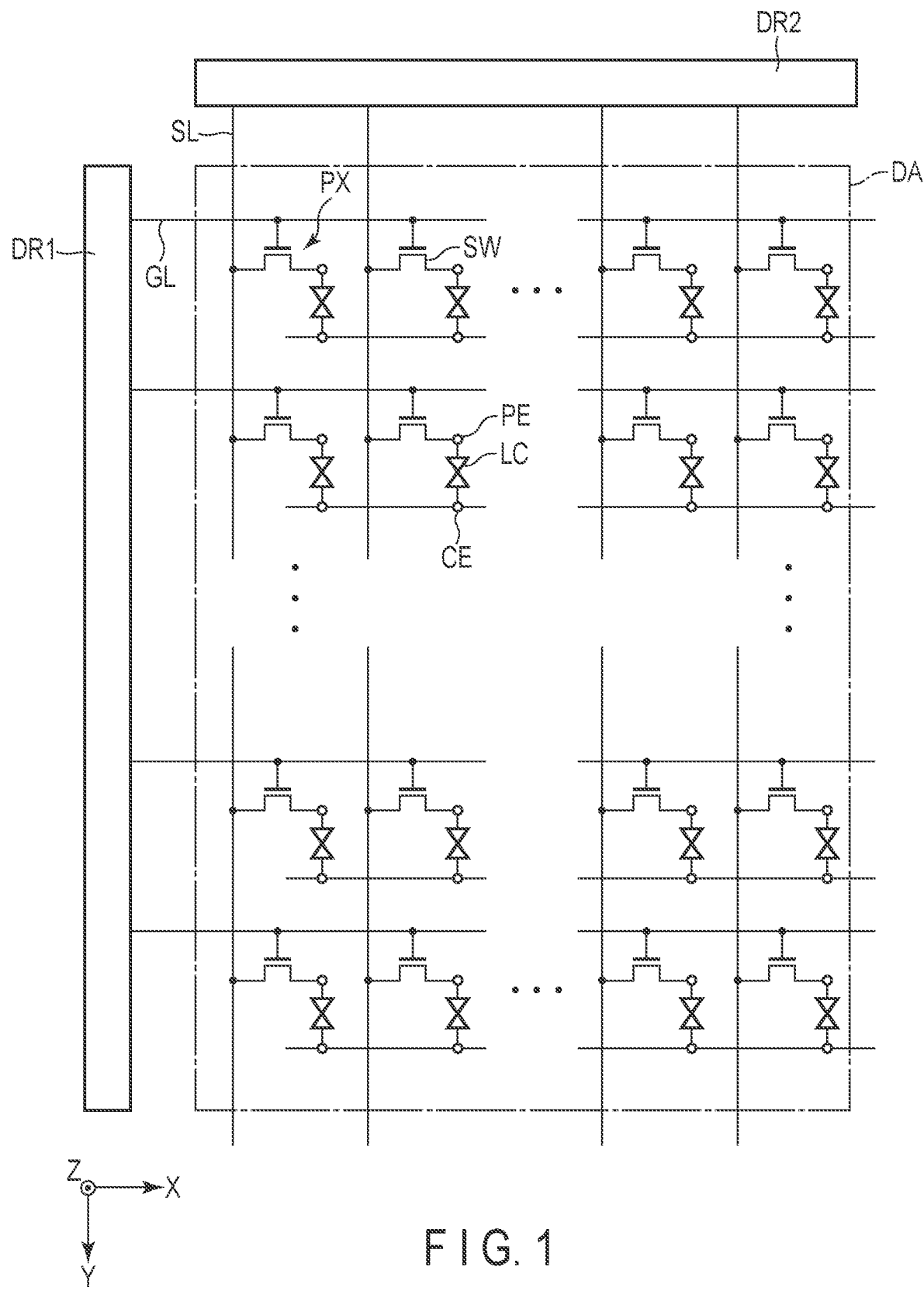
FIG. 1 is a diagram showing an example of an equivalent circuit of a display device.

In general, according to one embodiment, a display device comprises a plurality of scanning lines extending along a first direction; a plurality of signal lines extending along a second direction intersecting the first direction; a plurality of pixels provided at respective intersections of the plurality of signal lines and the plurality of scanning lines; a plurality of pixel electrodes each provided in a region partitioned by a first scanning line and a second scanning line adjacent to each other of the plurality of scanning lines, and, a first signal line and a second signal line adjacent to each other of the plurality of signal lines; a common electrode including a stem portion and a plurality of branch portions; and a third wiring line including a first region overlapping the plurality of scanning lines, and a second region overlapping the plurality of signal lines, wherein a region in which the pixel electrode and the first scanning line overlap each other is larger than a region in which the pixel electrode and the second scanning line overlap each other, when a length along a direction intersecting an extending direction of each of the third wiring line and the scanning lines is defined as a width, the width of the first region of the third wiring line is less than the width of the scanning lines, and the plurality of branch portions of the common electrode extend from the stem portion along the second direction.

According to another embodiment, a display device comprises a plurality of scanning lines extending along a first direction; a plurality of signal lines extending along a second direction intersecting the first direction; a plurality of pixels provided at respective intersections of the plurality of signal lines and the plurality of scanning lines; a plurality of pixel electrodes each provided in a region partitioned by a first scanning line and a second scanning line adjacent to each other of the plurality of scanning lines, and, a first signal line and a second signal line adjacent to each other of the plurality of signal lines; a common electrode including a stem portion, a plurality of first branch portions and a straight portion; and a third wiring line including a second stem portion and a plurality of second branch portions, wherein a region where the pixel electrode and the respective first scanning line overlap each other is larger than a region where the pixel electrode and the respective scanning line overlap each other, the first branch portions of the common electrode extend from the first stem portion along the second direction, the second branch portions of the third wiring line extend from the second stem portion along the second direction, and a width of the second stem portion of the third wiring line is less than a width of the scanning line.

According to still another embodiment, a display device comprises a plurality of scanning lines extending along a first direction; a plurality of signal lines extending along a second direction intersecting the first direction; a plurality of pixels provided at respective intersections of the plurality of signal lines and the plurality of scanning lines; a plurality of pixel electrodes each provided in a region partitioned by a first scanning line and a second scanning line adjacent to each other of the plurality of scanning lines, and, a first signal line and a second signal line adjacent to each other of the plurality of signal lines; a common electrode including a stem portion, a plurality of first branch portions and a protruding portion; and a third wiring line including a second stem portion and a plurality of second branch portions, wherein a region in which each pixel electrode and the respective first scanning line overlap each other is larger than a region in which each pixel electrode and the respective second scanning line overlap each other, and a width of the second stem portion of the third wiring is less than a width of the scanning line.

According to this embodiment, a display device with high reliability, fast response speed, and high brightness can be provided.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a display device with reference to the drawings.

In this embodiment, a first direction X, a second direction Y and a third direction Z are orthogonal to each other, but may intersect at an angle other than 90°. The direction toward the tip of the arrow in the third direction Z is defined as up or above, and the direction opposite to the direction toward the tip of the arrow in the third direction Z is defined as down or below. The first direction X, the second direction Y, and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the display device on a tip side of the arrow in the third direction Z. Here, viewing from this observation position toward the X-Y plane defined by the first direction X and the second direction Y is referred to as plan view. Viewing a cross-section of the display device in the X-Z plane defined by the first direction X and the third direction Z or in the Y-Z plane defined by the second direction Y and the third direction Z is referred to as cross-sectional view.

Embodiment

FIG. 1 is a diagram showing an example of an equivalent circuit of a display device.

The display device DSP comprises a plurality of pixels PX, a plurality of scanning lines GL and a plurality of signal lines SL in a display area DA, which display images. The scanning lines GL and the signal lines SL cross each other. Further, the display device DSP comprise a driver DR1 and a driver DR2 on an outer side of the display area DA. The scanning lines GL are electrically connected to the driver DR1. The signal lines SL are electrically connected to the driver DR2. The driver DR1 and the driver DR2 are controlled by a controller.

The pixels PX shown here are those referred to as sub-pixels or color pixels, and correspond to, for example, red pixels that displays red, green pixels that display green, blue pixels that display blue, or white pixels that display white. The pixels PX are provided at respective intersections between the scanning lines GL and the signal lines SL. Further, the pixels PX are each compartmentalized by two scanning lines GL and two signal lines SL.

Each pixel PX comprises a switching element SW, a pixel electrode PE and a common electrode CE opposing the pixel electrode PE. The switching element SW is electrically connected to the respective scanning line GL and the respective signal line SL. The pixel electrode PE is electrically connected to the switching element SW. That is, the pixel electrode PE is electrically connected to the signal line SL via the switching element SW. The common electrode CE is formed over a plurality of pixels PX. To the common electrode CE, a common potential is applied.

The driver DR1 supplies scanning signals to the scanning lines GL, respectively. The driver DR2 supplies video signals to the signal lines SL, respectively. In the switching element SW which electrically connected to the scanning line GL to which the scanning signal is supplied, the signal line SL and the pixel electrode PE are electrically connected each other, and a voltage corresponding to the video signal supplied to the signal line SL is applied to the pixel electrode PE. The liquid crystal layer LC is driven by the electric field generated between the pixel electrode PE and the common electrode CE. More precisely, by the electric field generated between the pixel electrode PE and the common electrode CE, the alignment of the liquid crystal molecules in the liquid crystal layer LC is changed from the initial alignment state where no voltage is applied. Through such operation, an image is displayed in the display area DA.

Figure 2:
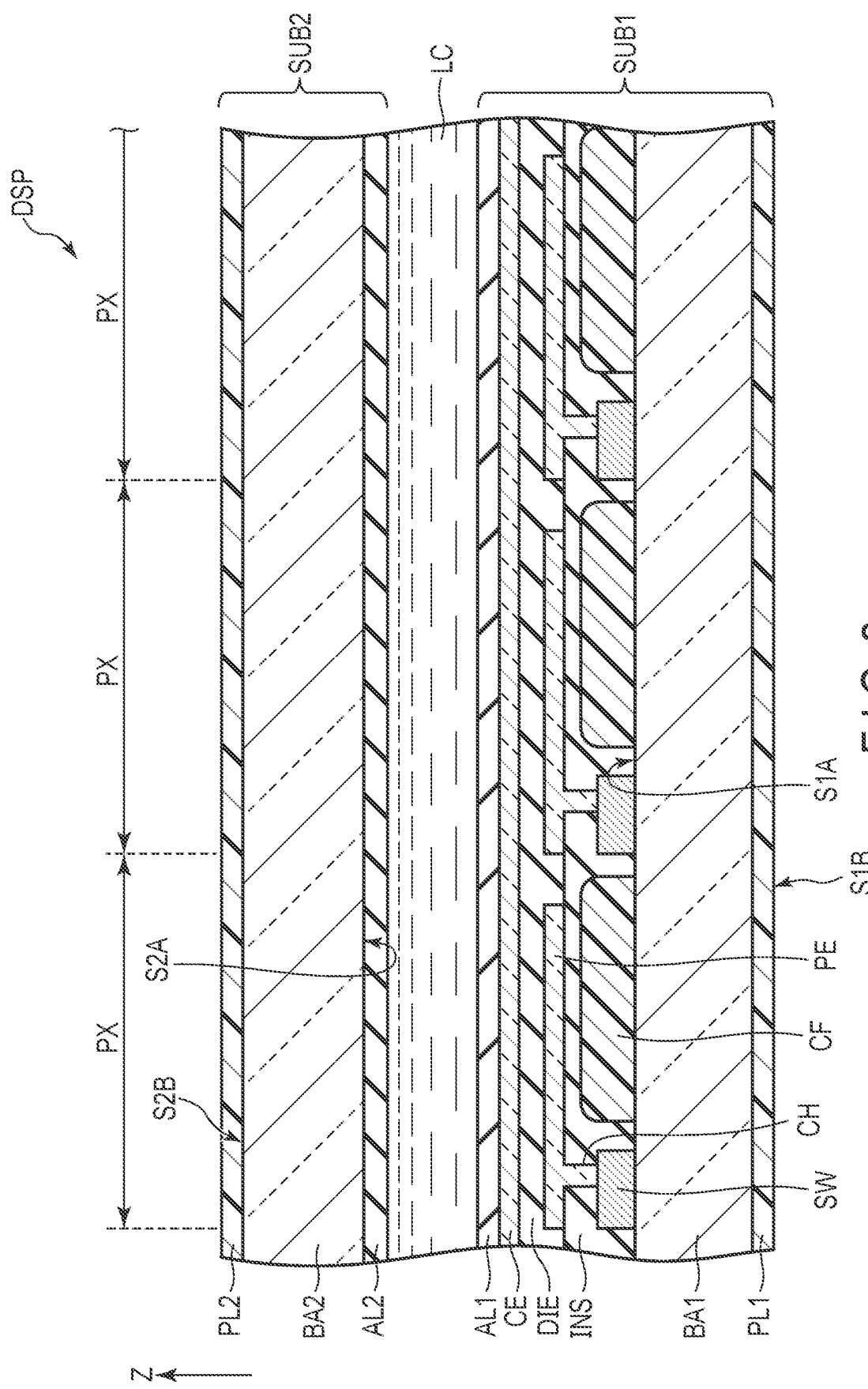
FIG. 2 is a cross-sectional view showing an example of a configuration of a display device.

FIG. 2 is a cross-sectional view showing an example of a configuration of the display device.

The display device DSP comprises a substrate SUB1, a substrate SUB2 and a liquid crystal layer LC held between the substrate SUB1 and the substrate SUB2.

The substrate SUB1 comprises a base BA1, an insulating layer INS, an insulating layer DIE and an alignment film AL1, in addition to the switching elements SW, the pixel electrodes PE, the common electrode CE and the like. The substrate SUB1 further comprises the scanning lines GL, the signal lines SL, the driver DR1, the driver DR2 and the like, shown in FIG. 1. The base BA1 is formed from a light-transparent glass base, resin substrate or the like. The base BA1 includes a main surface S1A opposing the substrate SUB2 and a main surface S1B on an opposite side to the main surface S1A.

The switching element SW is formed on a main surface S1A side of the base BA1 and is covered by the insulating layer INS. In the example illustrated in FIG. 2, the switching element SW is shown in simplified form for convenience of explanation of the embodiment, and the scanning lines GL and signal lines SL are omitted from the illustration. Note that, in practice, the insulating layer INS may include multiple insulating layers. The switching element SW includes semiconductor layers and various electrodes formed in these layers.

On the main surface S1A side of the base BA1, color filters CF are formed and covered by the insulating layer INS. The display device DSP in this embodiment has a color-filter-on-array (COA) type configuration in which the color filters CF are formed on the same substrate SUB1 (the array substrate) as that of the switching element SW. With this structure, the color filters CF are each formed between the respective switching element SW and the liquid crystal layer LC to ensure the color mixing suppression effect. In FIG. 2, the color filters CF are each provided to overlap the respective pixel electrode PE.

The pixel electrodes PE are formed on the insulating layer INS and are each provided for the respective one of the pixels PX. The pixel electrodes PE are covered by the insulating layer DIE. The common electrode CE is provided over a plurality of pixels PX. The common electrode CE is formed on the insulating layer DIE and opposes the pixel electrodes PE via the insulating layer DIE.

The pixel electrodes PE are each electrically connected to the respective switching element SW via a respective contact hole CH that penetrates the insulating layer INS. The pixel electrodes PE and the common electrode CE are transparent electrodes formed of, for example, a transparent conductive material such as indium tin oxide (ITO), indium zinc oxide (IZO) or the like.

The alignment film AL1 covers the common electrode and is in contact with the liquid crystal layer LC. The alignment film AL1 is, for example, an optical alignment film that has been subjected to optical alignment treatment.

The substrate SUB2 includes a base BA2 and an alignment film AL2. The base BA2 is formed from a light-transparent glass base material, a resin base material or the like. The base BA2 includes a main surface S2A opposing the substrate SUB1 and a main surface S2B on an opposite side to the main surface S2A.

The alignment film AL2 is provided in contact with the base BA2 and is in contact with the liquid crystal layer LC. The alignment film AL2 is an optical alignment film that has been subjected to optical alignment treatment, as in the case of the alignment film AL2.

Between the alignment film AL2 and the base BA2, insulating layers, light-shielding layers opposing the respective switching element SW and the like may be provided.

On the main surface S1B of the base BA1, a polarizer PL1 is adhered, and a polarizer PL2 is adhered to the main surface S2B of the base BA2.

Figure 3:
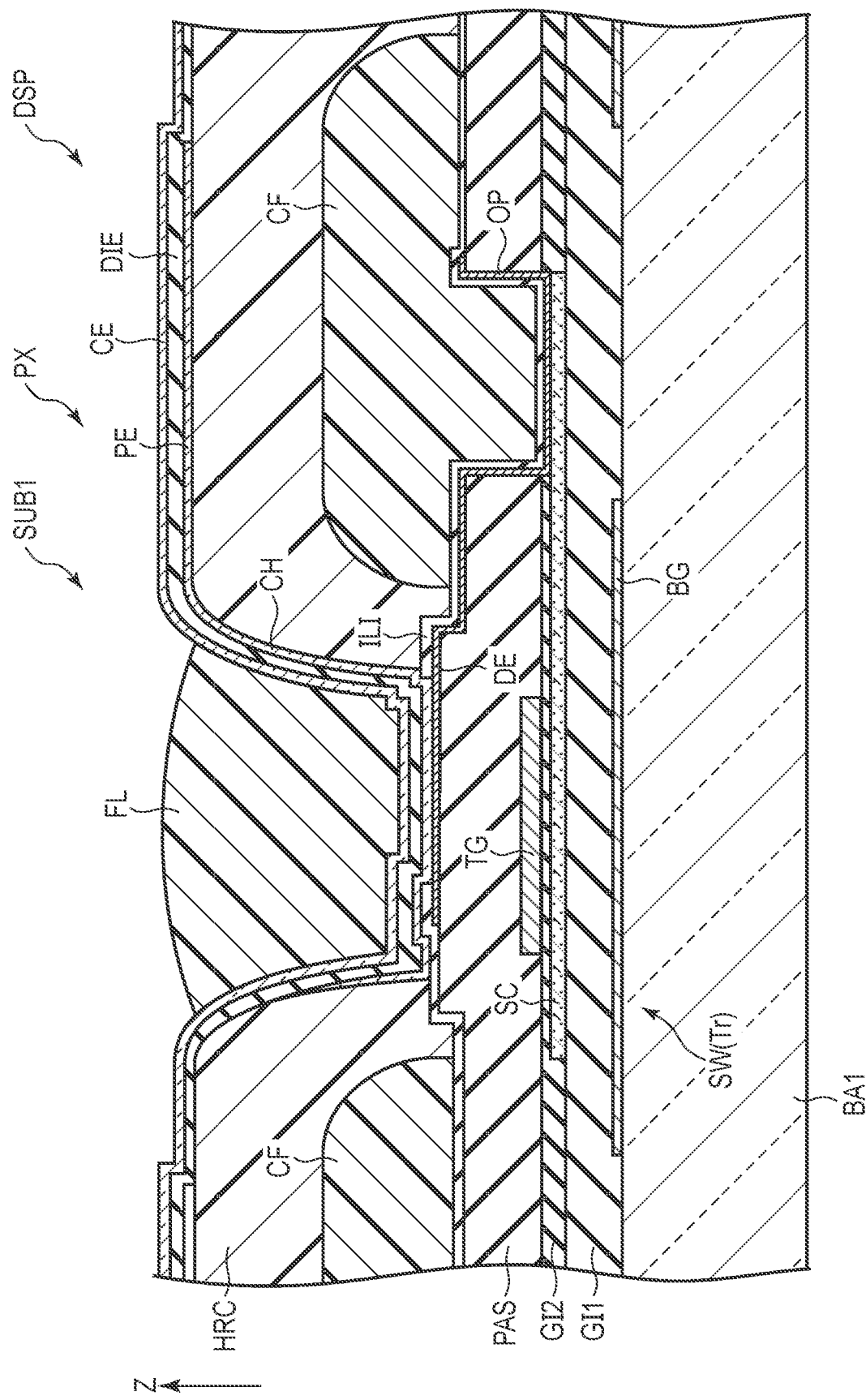
FIG. 3. is a cross-sectional view showing an example of a configuration of a substrate.

FIG. 3 is a cross-sectional view showing an example of the configuration of the substrate SUB1.

On the base BA1, a thin-film transistor (TFT) is provided as a switching element SW. The switching element SW may as well be referred to as a transistor Tr.

The transistor Tr comprises a gate electrode BG, a semiconductor layer SC, an insulating layer GI, a drain electrode DE, an insulating layer PAS and a gate electrode TG. The gate electrode BG and the gate electrode TG may as well be referred to as a bottom gate and a top gate, respectively. Alternatively, the gate electrode BG and the gate electrode TG may as well be referred to as a first gate electrode and a second gate electrode, respectively. Between the base BA1 and the gate electrode BG, an insulating layer may be provided. The gate electrode BG further functions as a light-shielding layer for the semiconductor layer SC as well.

The gate electrode BG may be formed using a metal material, for example, a single layer of a metal film or a stacked layered film of multiple metal films. Specific examples include a molybdenum-tungsten alloy (MoW) film or a stacked film in which an aluminum alloy film is sandwiched by titanium films.

In order to cover the gate electrode BG and the base BA1, an insulating layer GI1 is provided. The insulating layer GI1 is formed, for example, from a single layer of silicon oxide or silicon nitride, or a multilayer thereof. As the insulating layer GI1, an inorganic material containing oxygen, for example, silicon oxide is more preferably employed. The insulating layer GI may have the function of blocking impurities from glass, etc.

The semiconductor layer SC is provided on the gate electrode BG while interposing the insulating layer GI1 therebetween. The semiconductor layer SC is formed, for example, using an oxide semiconductor such as indium gallium zinc oxide (IGZO), indium tin zinc oxide (ITZO), zinc oxide nitride (ZnON), indium gallium oxide (IGO) or the like. Note that the material of the semiconductor layer SC is not limited to these, but silicon may as well be used.

In order to cover the semiconductor layer SC and the insulating layer GI1, an insulating layer GI2 is provided. The insulating layer GI2, as in the case of the insulating layer GI1, can be formed by a single layer of silicon oxide or silicon nitride or a multilayer thereof.

On the insulating layer GI2, the gate electrode TG is provided to oppose the semiconductor layer SC. The gate electrode TG can be formed using a metal material, for example, a single layer of metal film or a stacked film of multiple metal films. Specific examples thereof include a molybdenum-tungsten alloy (MoW) film and a stacked film in which an aluminum alloy film is sandwiched between titanium films.

The semiconductor layer SC is provided between the gate electrode BG and the gate electrode TG. It can be said that the gate electrode TG is formed to oppose the gate electrode BG while interposing the semiconductor layer SC therebetween. The insulating layer GI2 is provided between the gate electrode TG and the semiconductor layer SC, whereas the insulating layer GI1 is provided between the gate electrode BG and the semiconductor layer SC.

The insulating layer PAS is provided to cover the insulating layer GI2 and the gate electrode TG. The insulating layer PAS is formed, for example, from a single layer of silicon oxide or silicon nitride or a stacked layer thereof.

On the insulating layer PAS, the drain electrode DE is provided. The drain electrode DE is in contact with a part of the semiconductor layer SC via a contact hole OP provided in the insulating layer PAS. The drain electrode DE overlaps the gate electrode TG in plan view and further overlaps the pixel electrode PE. The drain electrode DE is formed of the transparent conductive material described above, for example ITO or IZO.

Although not shown in the figure, the signal lines SL are formed in the same layer as that of the drain electrode DE. The signal lines SL, as in the case of the drain electrode DE, are each in contact with another part of the semiconductor layer SC via a contact hole provided in the insulating layer PAS.

In order to cover the insulating layer PAS and the drain electrode DE, an insulating layer ILI is provided. The insulating layer ILI can be formed from a single layer of silicon oxide or silicon nitride or a stacked layer thereof.

On the insulating layer ILI, color filters CF are provided for the respective pixels PX. The color filters CF can be made, for example, from a transparent resin in which a respective coloring material is mixed. In FIG. 3, adjacent color filters CF are formed to be of different colors.

In order to cover the insulating layer ILI and the color filters CF, an insulating layer HRC is provided. The insulating layer HRC is formed of an organic insulating material, for example, polyimide or acrylic resin. A contact hole CH is provided in the insulating layer HRC above the respective semiconductor layer SC and the respective gate electrode TG.

The pixel electrode PE is provided on the insulating layer HRC so as to cover the contact hole CH. The pixel electrode PE is in contact with the drain electrode DE at a bottom portion of the contact hole CH. The pixel electrode PE is provided to overlap the respective color filter CF.

The insulating layer DIE is provided to cover the pixel electrode PE. The insulating layer DIE may be formed of a single layer of silicon oxide or silicon nitride or a stacked layer thereof, but it is preferable to be formed of an insulating material having high dielectric constant. In FIG. 3, the insulating layer DIE is formed of a single layer of silicon nitride film.

The common electrode CE is provided to cover the insulating layer DIE. As described above, the common electrode CE is provided over a plurality of pixels PX. The pixel electrode PE and the common electrode CE can each be formed of a transparent conductive material such as ITO or IZO, as described above.

On the common electrode CE, an insulating layer FL is provided so as to cover the contact hole CH. The insulating layer FL can be made of a resin material.

Figure 4:
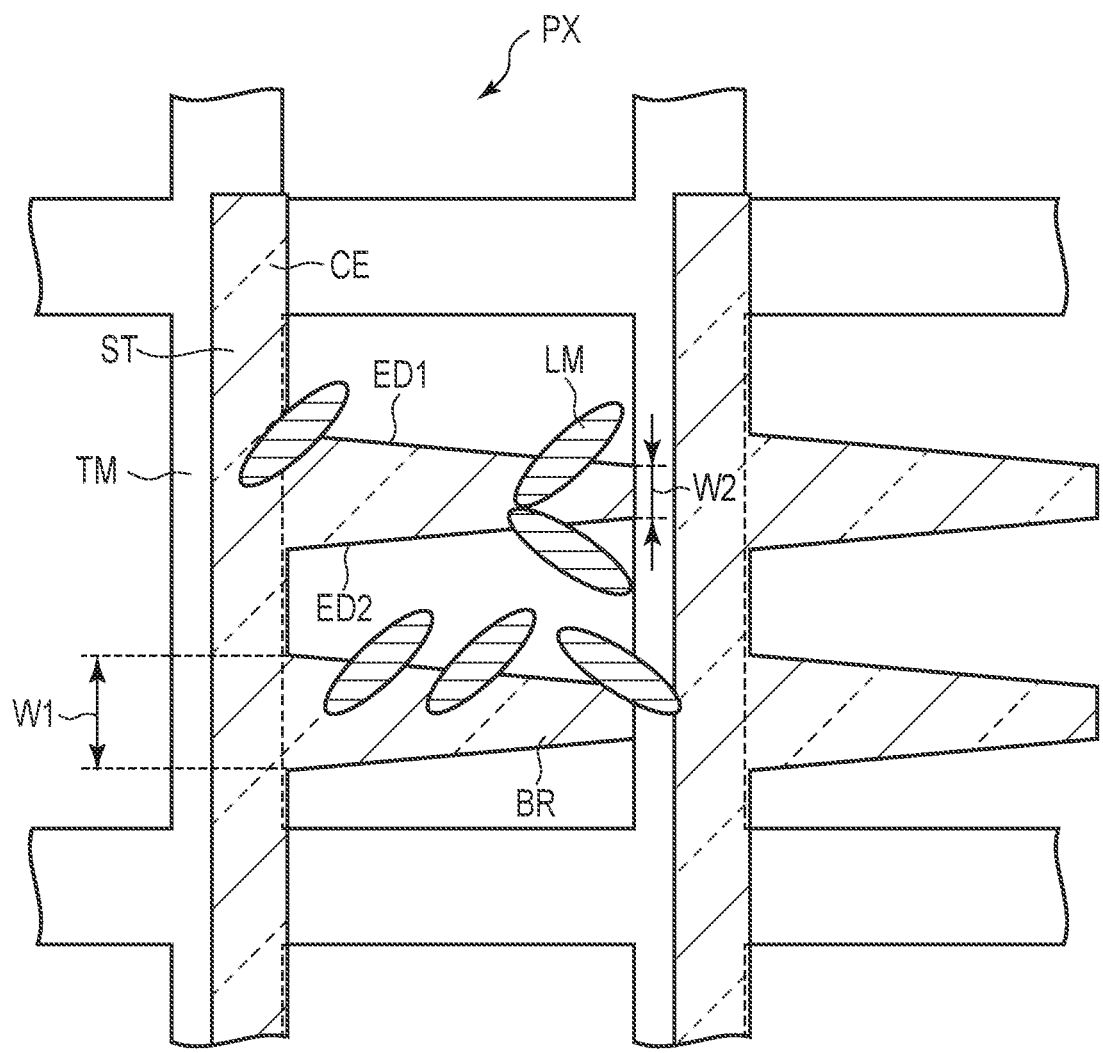
FIG. 4 is a plan view showing an example of a pixel of a comparative example.

FIG. 4 is a plan view of an example of a pixel of a comparative example. In FIG. 4, only wiring lines TM and common electrodes CE are shown to make the drawing easier to understand. The wiring lines TM may be provided above or below the common electrodes CE. The wiring lines TM are provided to cover the signal lines SL and the scanning lines GL. The wiring lines TM have the function of light-shielding for the signal lines SL and the scanning lines GL. When the scanning lines GL are defined as the first wiring lines and the signal lines SL are the second wiring lines, the wiring lines TM may as well be referred to as third wiring lines.

The common electrode CE includes a plurality of branch portions BR extending along the first direction X and a stem portion ST extending along the second direction Y. The branch portions BR and the stem portion ST are formed to be integrated and electrically connected with each other. In the example illustrated, the branch portions BR extend from the stem portion ST toward the right-hand side of the figure. The branch portions BR are, for example, tapering down toward the distal end on the right-hand side of the figure (which may as well be referred to as "wedge-shaped"), and a width W1 of the portion connected to the stem portion ST is greater than a width W2 at the distal end. The widths here are each a length taken along the second direction Y. Note that in this embodiment, the length along a direction that intersects the extending direction of the electrodes and wiring lines is referred to as the width.

When the liquid crystal layer LC shown in FIG. 2 has positive dielectric anisotropy (positive type), an alignment treatment direction AD of the alignment films AL1 and AL2 is parallel to the first direction X. In other words, the alignment treatment direction AD is parallel to the extending direction of the branch portions BR. Further, the initial alignment direction of the liquid crystal molecules LM contained in the liquid crystal layer LC is parallel to the first direction X. Here, the liquid crystal layer LC is described supposing that it is of a positive type.

When the liquid crystal layer LC shown in FIG. 2 has negative dielectric anisotropy (negative type), the alignment treatment direction of the alignment films AL1 and AL2 is parallel to the second direction Y. That is, the alignment treatment direction in this case is orthogonal to the extending direction of the branch portions BR. Further, the initial alignment direction of the liquid crystal molecules is parallel to the second direction Y.

When a voltage according to the video signal is applied to the pixel electrode PE, an electric field is generated so as to intersect edges ED1 and edges ED2 of the branch portions BR in the X-Y plane. The liquid crystal molecules LM spin so that their longitudinal axes are substantially parallel to the electric field. For example, those of the liquid crystal molecules LM located in the vicinity of the edge ED1 spin counterclockwise. Those of the liquid crystal molecules LM located in the vicinity of the edge ED2 spin clockwise. In other words, with respect to the branch portions BR, the direction of spin of the liquid crystal molecules LM differs from one case to another between an edge ED1 side and an edge ED2 side.

As the resolution of the display device DSP is higher, the area of each of the pixels PX decreases. Therefore, the length of the branch portions BR along the first direction X decreases as well. If the branch portions BR are extended to the full length (width) of the pixel PX along the first direction X, there is a risk that they may be electrically connected to the wiring lines TM.

On the other hand, if the length of the branch portions BR is shortened in order to prevent continuation between the branch portions BR and the wiring lines TM, the number of spinning liquid crystal molecules may decrease, thereby undesirably resulting in the lowering of the brightness of the display device DSP.

Figure 5:
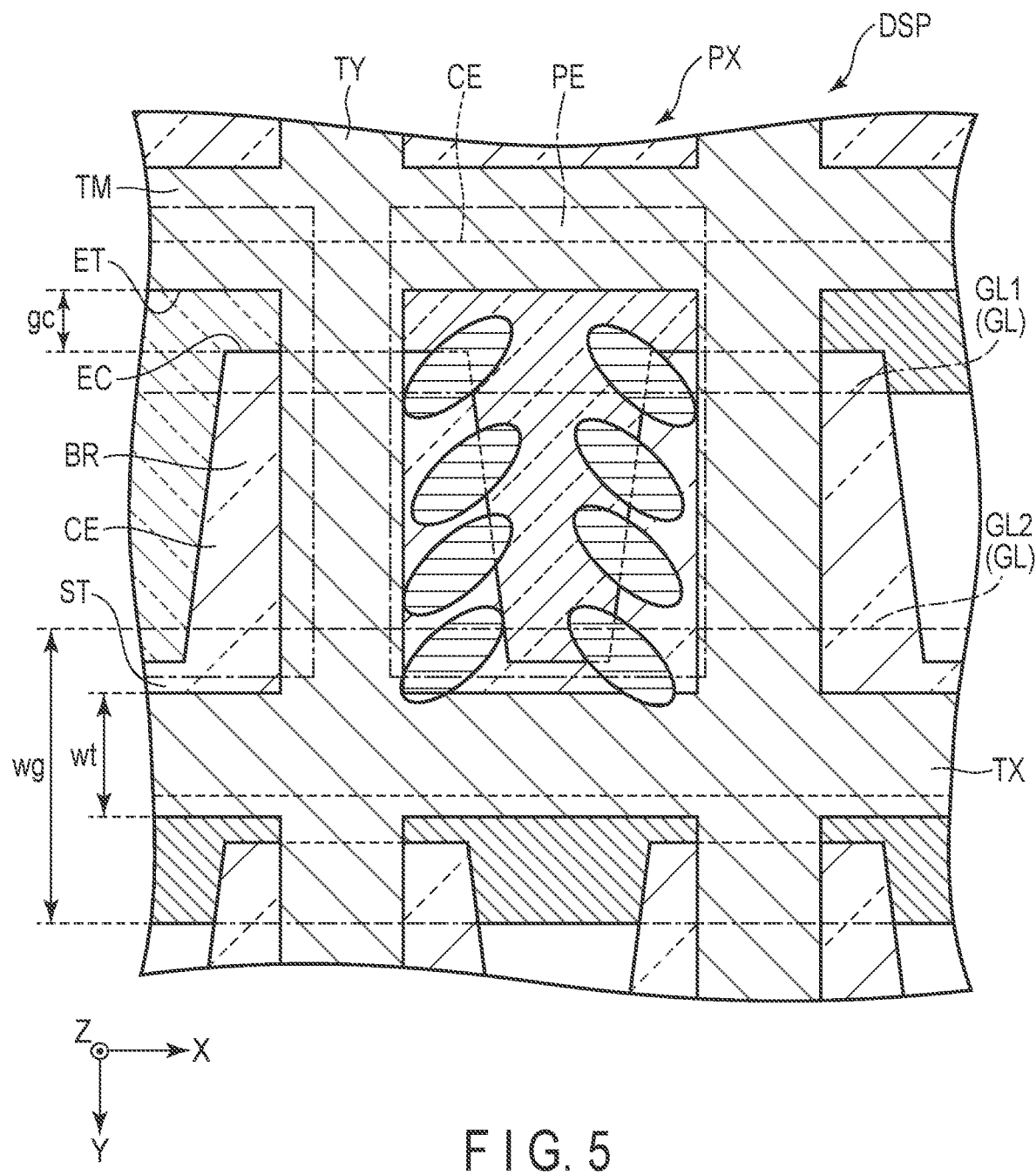
FIG. 5 is a plan view showing an example of a pixel of this embodiment.

FIG. 5 is a plan view showing an example of a pixel of this embodiment. In FIG. 5, some of the structural elements are omitted to make the drawing easier to understand.

The scanning lines GL shown in FIG. 5 extend along the first direction X. The length (width) of the scanning lines GL taken along the second direction Y is represented by wg. Although not shown in the figure, the signal lines SL extend along the second direction Y. The signal lines SL are covered by a region TY of the wiring lines TM, which extend along the second direction Y.

The pixel electrodes PE are provided to overlap the region compartmentalized by two scanning lines GL and two signal lines SL. Note here that the pixel electrodes PE do not overlap equally the two scanning lines GL. The region where the pixel electrode PE overlaps one of the scanning lines GL is larger than the region overlapping the other one. Of the two scanning lines GL, the one (scanning line GL) which is adjacent to distal ends of the branch portions BR of the common electrode CE is referred to as a scanning line GL1. The scanning line GL which the stem portion ST of the common electrode CE overlaps is referred to as a scanning line GL2. The region where the pixel electrode PE overlaps the scanning line GL1 is larger than the region where the pixel electrode PE overlaps the scanning line GL2. In other words, the length of the region where the pixel electrode PE overlaps the scanning line GL1 along the second direction Y is longer than the length of the region where the pixel electrode PE overlaps the scanning line GL2 along the second direction Y. That is, it can be said that the pixel electrode PE is located on an upper side of the drawing (in an opposite direction to the second direction Y) with respect to the center of the distance between the two scanning lines, that is, scanning lines GL1 and GL2.

The stem portion ST of the common electrode CE shown in FIG. 5 extends along the first direction X. The branch portions BR of each of the pixels PX extend from the stem portion ST along the direction opposite to the second direction Y, from a lower side to the upper side of the drawing. The distance (interval) from the distal ends EC of the branch portions BR in one pixel PX to an edge ET of the adjacent wiring lines TM along the second direction Y is represented by gc.

The branch portions BR are provided to overlap two pixels PX adjacent to each other along the first direction X. With this configuration, for example, the region on the right-hand side of the drawing of one branch portion BR and the region on the left-hand side of the drawing of the other branch portion BR adjacent thereto along the first direction X are located in one pixel PX. Here, it can be said that the half regions of the respective two branch portions BR adjacent along the first direction X oppose each other.

The wiring lines TM include a region TX overlapping a part of the scanning line GL and extending along the first direction X and a region TY covering the signal line SL and extending along the second direction Y. The length (width) along the second direction Y of the region TX extending along the first direction X is referred to as a width wt. Note that the regions TX and TY are also referred to as first and second regions, respectively. It can be said that the length (width) of the region TY along the first direction X is greater than the width of the signal lines SL.

As described above, the branch portions BR of this embodiment extend from the stem portion ST from the lower side of the drawing to the upper side. The length along the second direction Y of the region where the pixel electrode PE overlaps the scanning line GL1 is greater than the length along the second direction Y of the region where the pixel electrode PE overlaps the scanning line GL2. The width wt of the region TX extending along the first direction X of the wiring lines TM is less than the width wg of the scanning lines GL. In a pixel PX having such a configuration, the distance gc can be sufficiently obtained. Thus, when the liquid crystal molecules LM aligned to the end portions EC of the branch portions BR are spun by the electric field, a sufficient region can be obtained.

With the configuration shown in FIG. 5, the common electrode CE and the wiring lines TM can be disposed to be sufficiently spaced apart from each other. Therefore, the branch portions BR of the common electrode CE do not overlap the wiring lines TM. Thus, it is possible to prevent short-circuiting between the common electrode CE and the wiring lines TM.

Figure 6:
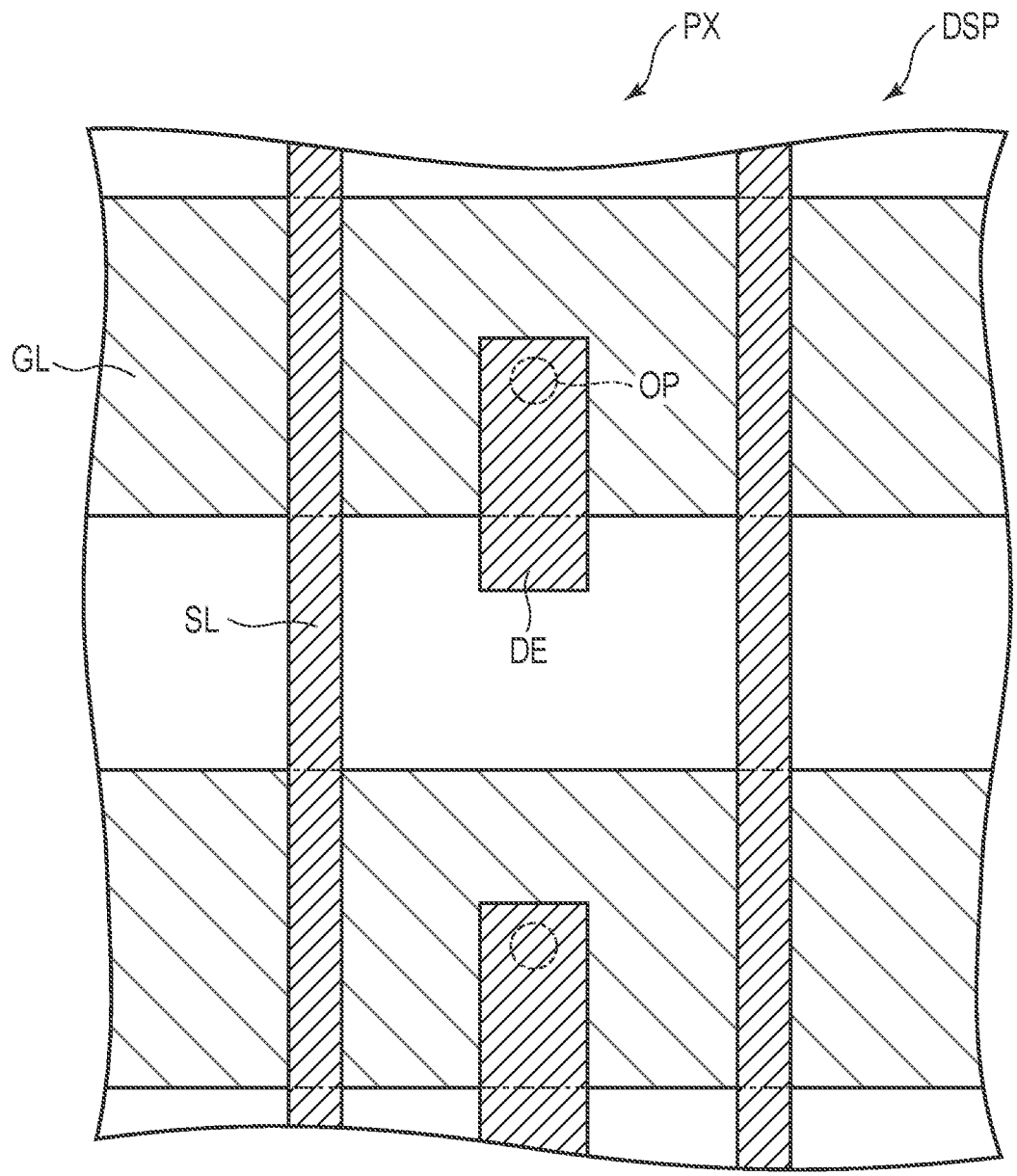
FIG. 6 is a plan view showing scanning lines, signal lines and a drain electrode of structural elements shown in FIG. 5.

FIG. 6 is a plan view showing the scanning lines GL, the signal lines SL and the drain electrodes DE of the structural elements shown in FIG. 5. The scanning lines GL extend along the first direction X. The signal lines SL and the drain electrodes DE extend along the second direction Y.

Figure 7:
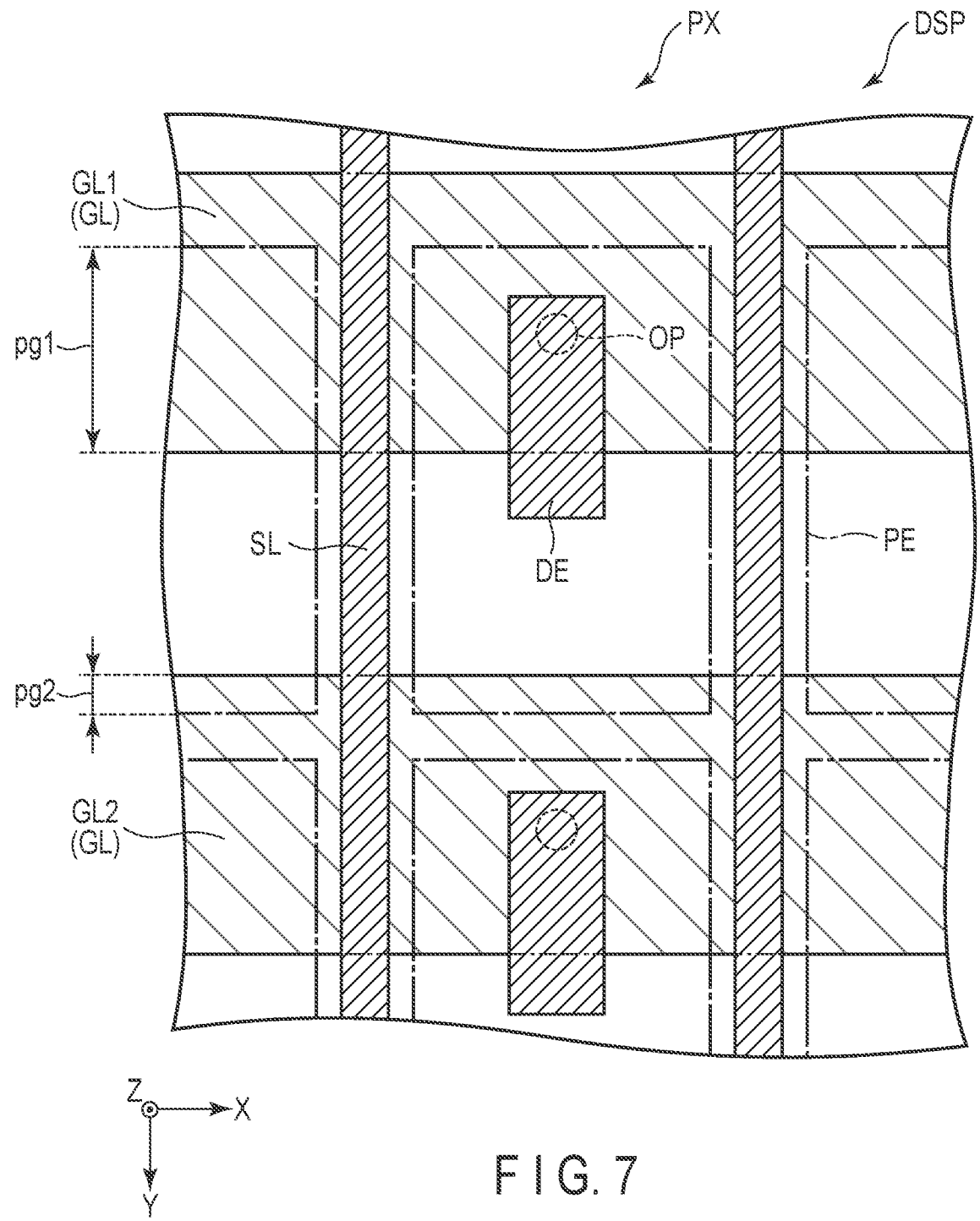
FIG. 7 is a plan view showing scanning lines, signal lines, a drain electrode and a pixel electrode of the structural elements shown in FIG. 5.

FIG. 7 is a plan view showing the scanning lines GL, the signal lines SL, the drain electrodes DE and the pixel electrodes PE of the structural elements shown in FIG. 5. Each of the pixel electrodes PE is provided between each respective pair of signal lines SL adjacent to each other. The pixel electrodes PE are each provided between each respective scanning lines GL adjacent to each other and overlap each respective pair of scanning lines GL. As described above, in each pair of scanning lines GL1 and GL2, a length pg1 along the second direction Y of the region where the pixel electrode PE overlaps the scanning line GL1 is greater than a length pg2 along the second direction Y of the region where the pixel electrode PE overlaps the scanning line GL2.

Figure 8:
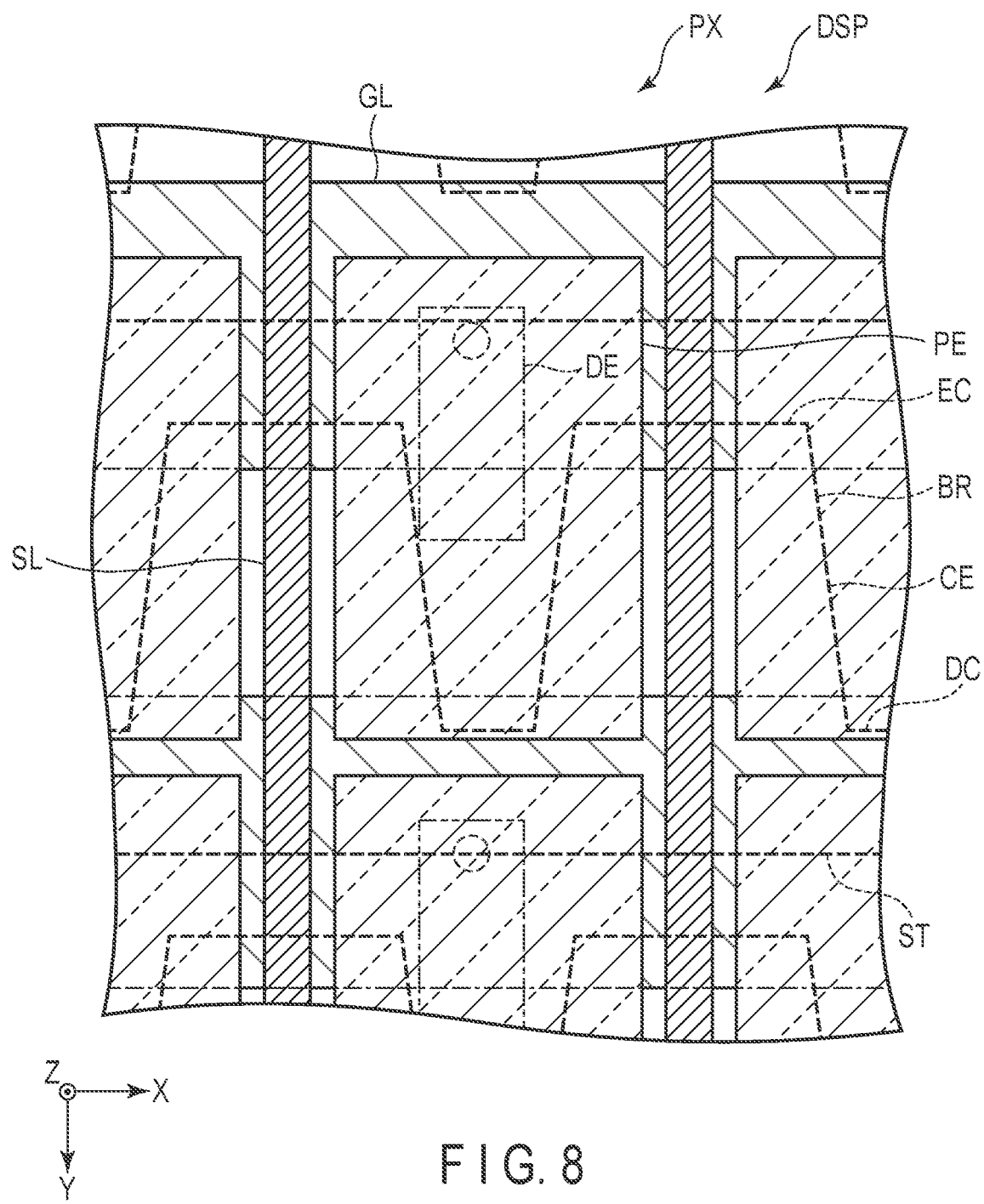
FIG. 8 is a plan view showing scanning lines, signal lines, a drain electrode, a pixel electrode and a common electrode of the structural elements shown in FIG. 5.
Figure 9:
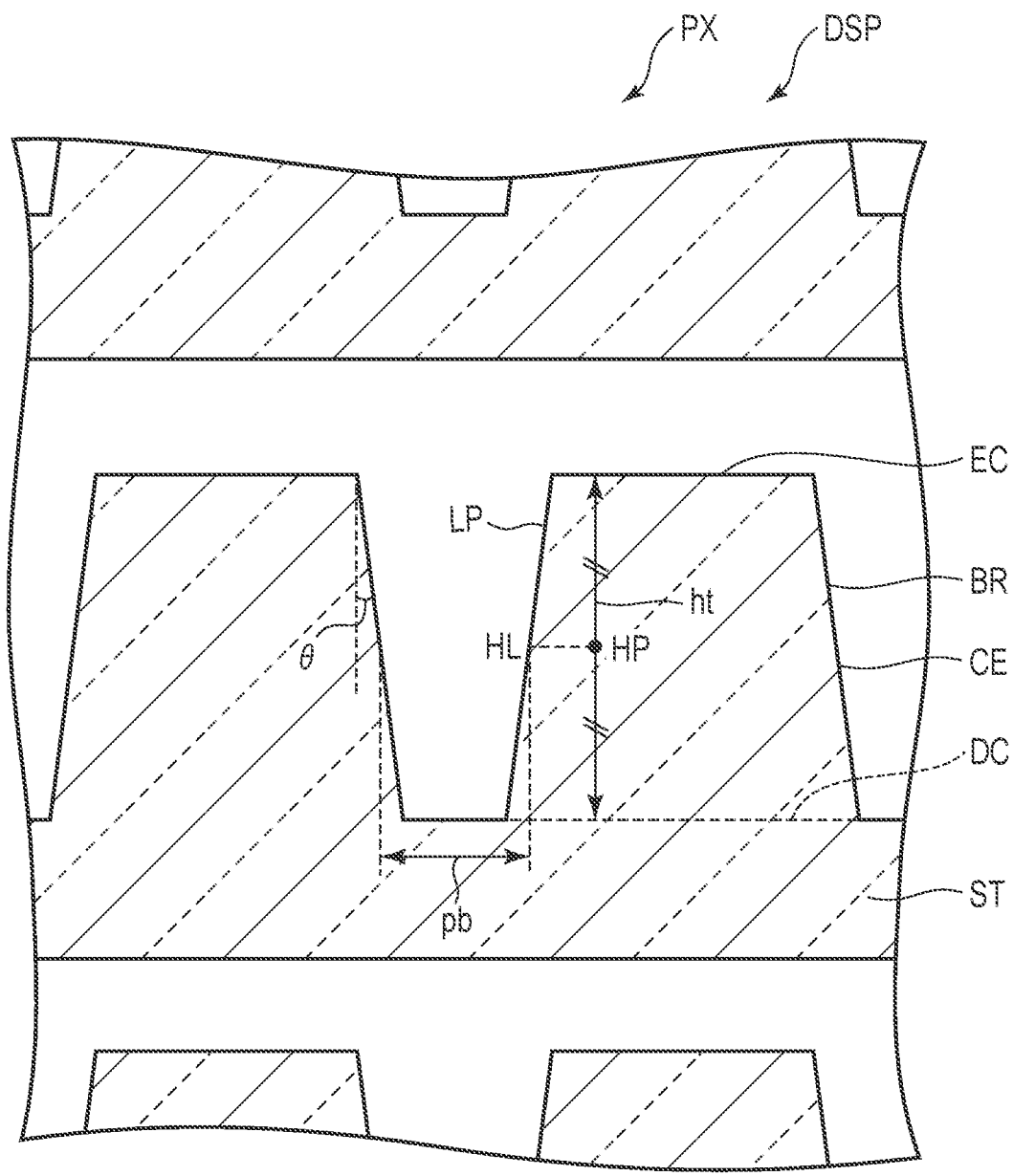
FIG. 9 is a plan view showing the common electrode of the structural elements shown in FIG. 5.

FIG. 8 is a plan view showing the scanning lines GL, the signal lines SL, the drain electrodes DE, the pixel electrodes PE and the common electrode CE of the structural elements shown in FIG. 5. FIG. 9 is a plan view showing the common electrode CE of the structural elements shown in FIG. 5. The stem portion ST of the common electrode CE extends along the first direction X. That is, the stem portion ST is disposed parallel to the scanning lines GL.

The branch portions BR of the common electrode CE extend from the stem portion ST along a direction parallel to the second direction Y. That is, the branch portions BR are disposed parallel to the signal lines SL.

The boundary between the stem portion ST and the branch portions BR is referred to as a boundary DC, and an oblique side of each branch portion BR is referred to as an oblique side LP. The length thereof from the boundary DC to the end portion EC along the second direction Y is referred to as a length ht. An imaginary point located half the length ht from the boundary DC is referred to as an imaginary point HP. The point where an imaginary line from an imaginary point HP and the oblique side LP intersect each other is referred to as a point HL. It can be said that the point HL is a point located at the half length of the oblique side LP.

In the branch portions BR adjacent to each other, the length (pitch) between points HL adjacent to each other is referred to as a length pb. The length pb should preferably be 0.2 µm or more and 4.5 µm or less, more preferably 0.5 µm or more and 2.5 µm or less. The angle made by the oblique side LP with respect to the second direction Y is referred to as an angle θ. The angle θ should preferably be 2° or more and 45° or less, more preferably 5° or more and 15° or less. The distance gc shown in FIG. 5 should preferably be 1.0 µm or more and 1.5 µm or less. By taking such lengths and angles, it is possible to obtain a display device DSP in which the liquid crystal molecules LM can spin more easily, the response speed is higher and the brightness is higher.

In this embodiment, the constitution is described in which the branch portions BR extend from the lower side of the drawing to the upper side, but the invention is not limited to this configuration. The branch portions BR may extend from the upper side of the drawing to the lower side, that is, in both ways along the second direction Y.

With this embodiment, the short-circuiting between the common electrode CE and the wiring lines TM can be suppressed and a sufficient area can be obtained for the liquid crystal molecules LM to spin. Thus, it is possible to obtain a display device with high reliability, fast response speed and high brightness.

Configuration Example 1

Figure 10:
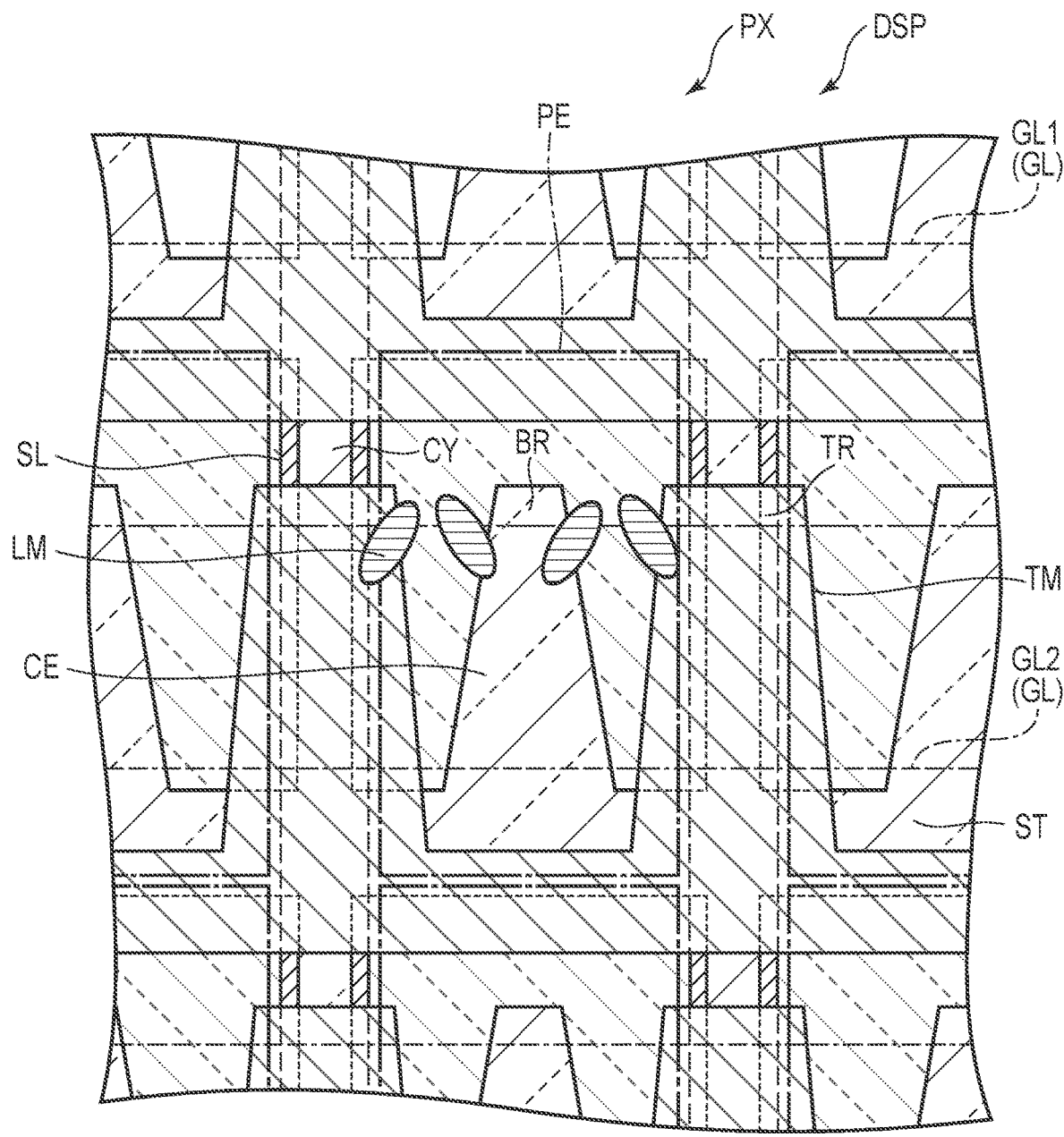
FIG. 10 is a plan view showing a configuration example of a display device in an embodiment.

FIG. 10 is a plan view showing another configuration example of the display device in the embodiment. The configuration example shown in FIG. 10 is different from that of FIG. 5 in that one branch portion BR is provided in one pixel PX. In addition to the feature that one branch portion BR is provided in one pixel PX, this configuration example is different also in that the wiring line TM includes a stem and branches.

In the configuration shown in FIG. 10, the scanning lines GL, the signal lines SL, the drain electrodes DE and the pixel electrode PE each have the same configuration as those shown in FIG. 7.

Figure 11:
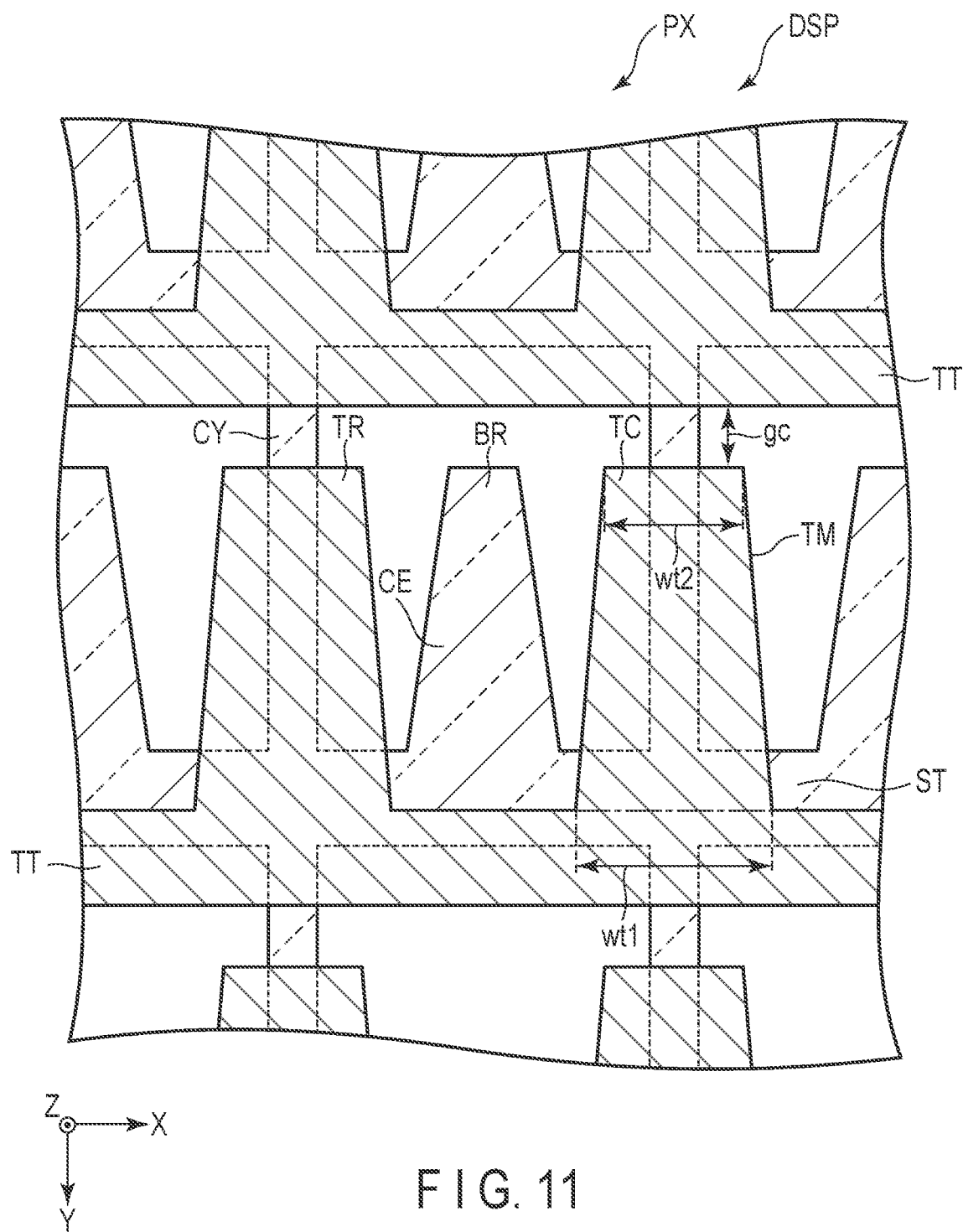
FIG. 11 is a plan view showing the common electrode and wiring lines of the structural elements shown in FIG. 10.
Figure 12:
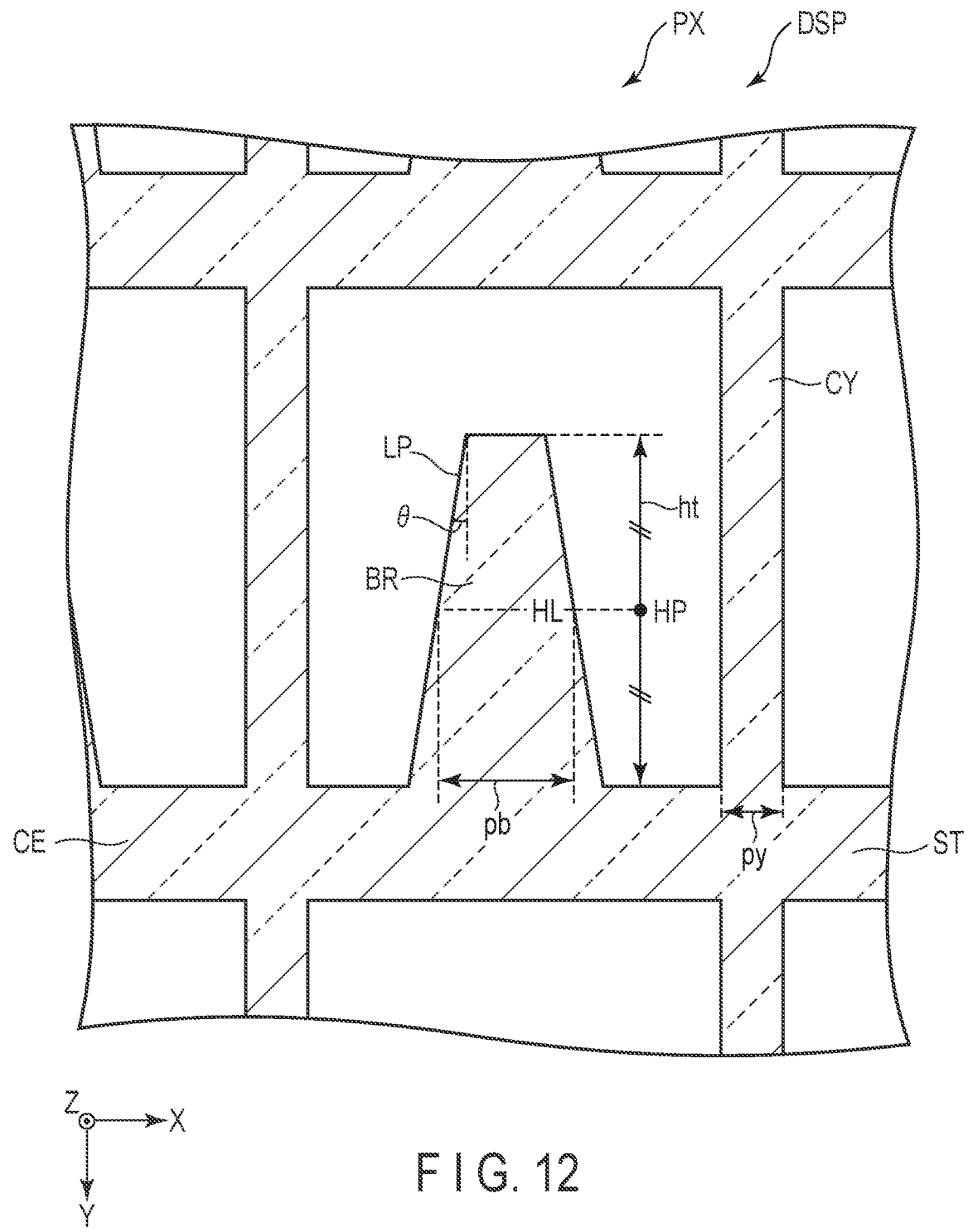
FIG. 12 is a plan view showing only the common electrode among the structural elements shown in FIG. 10.

FIG. 11 is a plan view showing the common electrode CE and the wiring lines TM of the structural elements shown in FIG. 10. FIG. 12 is a plan view showing only the common electrode CE of the structural elements shown in FIG. 10.

The common electrode CE includes a stem portion ST extending along the first direction X, branch portions BR protruding from the stem portion ST, and a straight portion CY extending along the second direction Y and overlapping the respective signal line SL. The straight portion CY has a wiring shape and is provided over respective pixels PX adjacent to each other along the second direction Y. The length (width) of the straight portion CY along the first direction X is less than the length (width) of the signal line SL along the first direction X. In this configuration example, the branch portion BR may as well be referred to as a first branch portion and the stem portion ST may as well be referred to as a first stem portion.

The stem portion ST, the branch portions BR and the straight portion CY are formed to be integrated as one piece. As described above, one branch portion BR is provided in one pixel PX, that is, within the area partitioned by a respective pair of two adjacent signal lines SL and a respective pair of two adjacent scanning lines GL.

The wiring line TM includes as a stem portion TT extending along the first direction X and a branch portion TR protruding from the stem portion TT. The branch portion TR, as in the case of the branch portions BR, extends from the lower side of the drawing to the upper side, that is, along the direction opposite to the second direction Y. As in the case of the branch portions BR, the branch portion TR has a tapered-down shape (wedge shape). Here, the width of portion of the branch portion TR, which overlaps a boundary between the branch portion TR and the stem portion TT is referred to as a width wt1, and the width of a distal end TC of the branch portion TR is referred to as a width wt2. The width wt1 is greater than the width wt2. In this configuration example, the branch portion TR may as well be referred to as a second branch and the stem portion TT may as well be referred to as a second stem portion.

With the configuration that the branch portion TR having a tapered-down shape is provided in a part of the wiring lines TM, the electric field generated between the branch portion TR and the pixel electrode PE is formed to be inclined with respect to the first direction X or the second direction Y in accordance with the wedge shape.

Further, the branch portion TR is provided to overlap the straight portion CY of the common electrode CE in plan view. As described above, since the straight portion CY overlaps the signal line SL, it can be said that the signal line SL, the straight portion CY and the branch portion TR are provided to overlap each other.

Between the end portion TC of the branch portion TR and the stem portion TT of the respective wiring lines TM adjacent to each other along the second direction Y, the straight portion CY of the common electrode CE is provided. With the straight portion CY, it is possible to shield the voltage applied to the signal line SL. Note here that the distance between the end portion TC of the wiring line TM and the stem portion TT is referred to as a distance gc.

As explained with reference to FIG. 9, a length pb and an angle θ are obtained in this configuration example as well. In this configuration example, the length pb is defined as a distance between points HL of branch portions BR provided in the pixel PX. In other words, the length pb is the width of the branch portion BR at the location of a half the height thereof. The length pb should preferably be 2.5 μm. The angle θ should preferably be 5° or more and 15° or less.

Further, the distance gc should be 1.0 μm or more and 1.5 μm or less. Moreover, here, the length (width) of the straight portion CY along the first direction X is referred to as a length py. The length py should preferably be 1.5 μm or more.

Further, the branch portion TR of the wiring TM in this configuration example does not overlap the branch portion BR of the common electrode CE in plan view. It can be said that the branches TR and BR are disposed alternately along the first direction X.

Note that in this configuration example, the branch portion TR of the wiring line TM is tapered-down in shape, but the shape of the branch portion TR is not limited to this. The length (width) of the branch portion TR along the first direction X may as well be constant.

In this configuration example, the straight portion CY is provided as a part of the common electrode CE, but the configuration thereof is not limited to this. The straight portion CY may as well be a part of the wiring line TM. Further, both the wiring line TM and the common electrode CE may as well include a straight portion. In such a case, the wiring line TM and the common electrode CE may have the same shape.

This configuration example is described in connection with the configuration in which the branch portions BR and TR extend from the lower side of the drawing to the upper side, but the present invention is not limited to this configuration. The branch portions BR and TR may as well extend from the upper side of the drawing to the lower side, that is, along the second direction Y.

In this configuration example, advantageous effects similar to those of the embodiment are achieved.

Configuration Example 2

Figure 13:
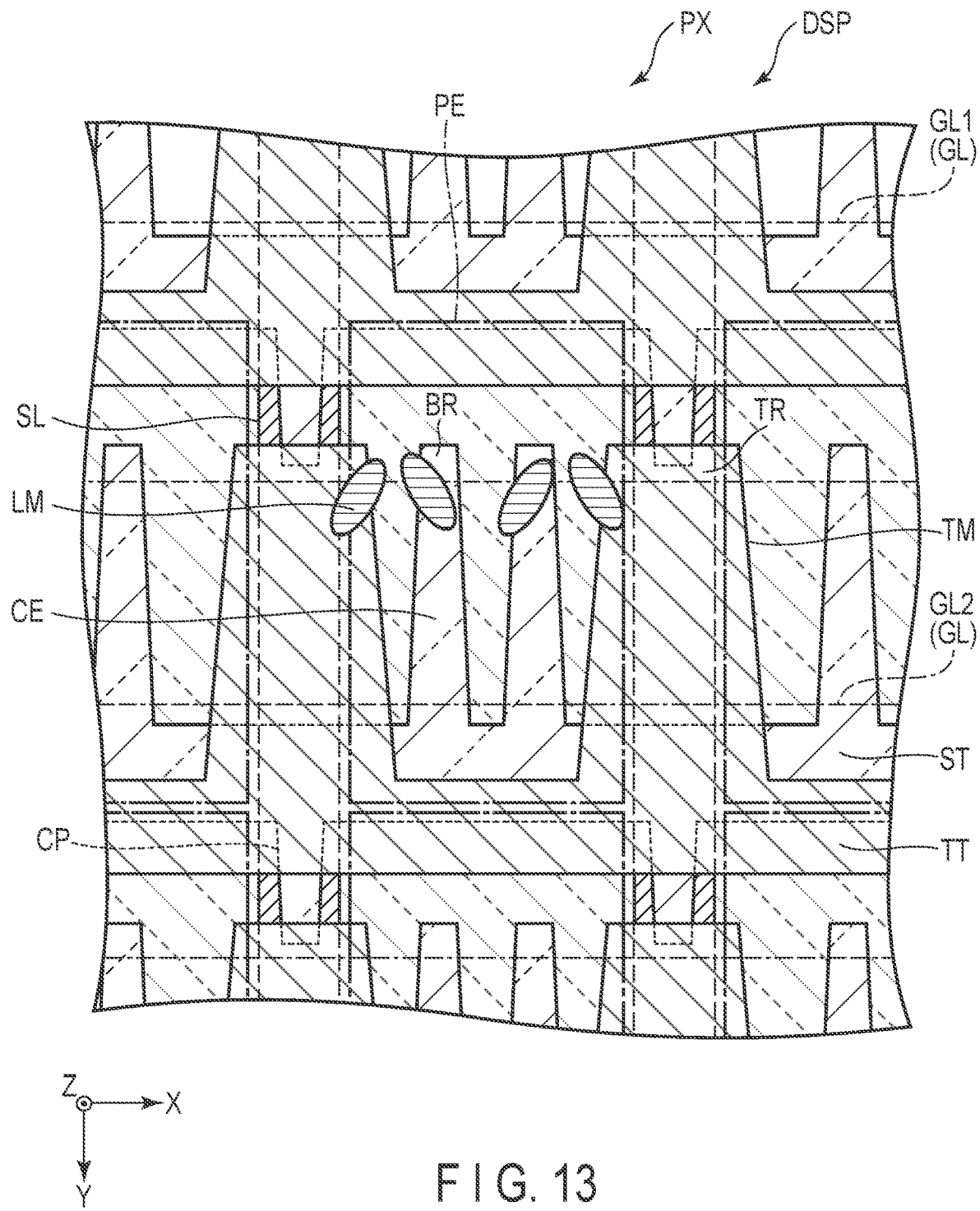
FIG. 13 is a plan view showing a configuration example of a display device in an embodiment.

FIG. 13 is a plan view of another configuration example of the display device in the embodiment. The configuration example shown in FIG. 13 is different from that of FIG. 10 in that two branch portions BR are provided in a single pixel PX.

In the configuration shown in FIG. 13, scanning lines GL, signal lines SL, a drain electrode DE and a pixel electrode PE are the same in configuration as those shown in FIG. 7.

Figure 14:
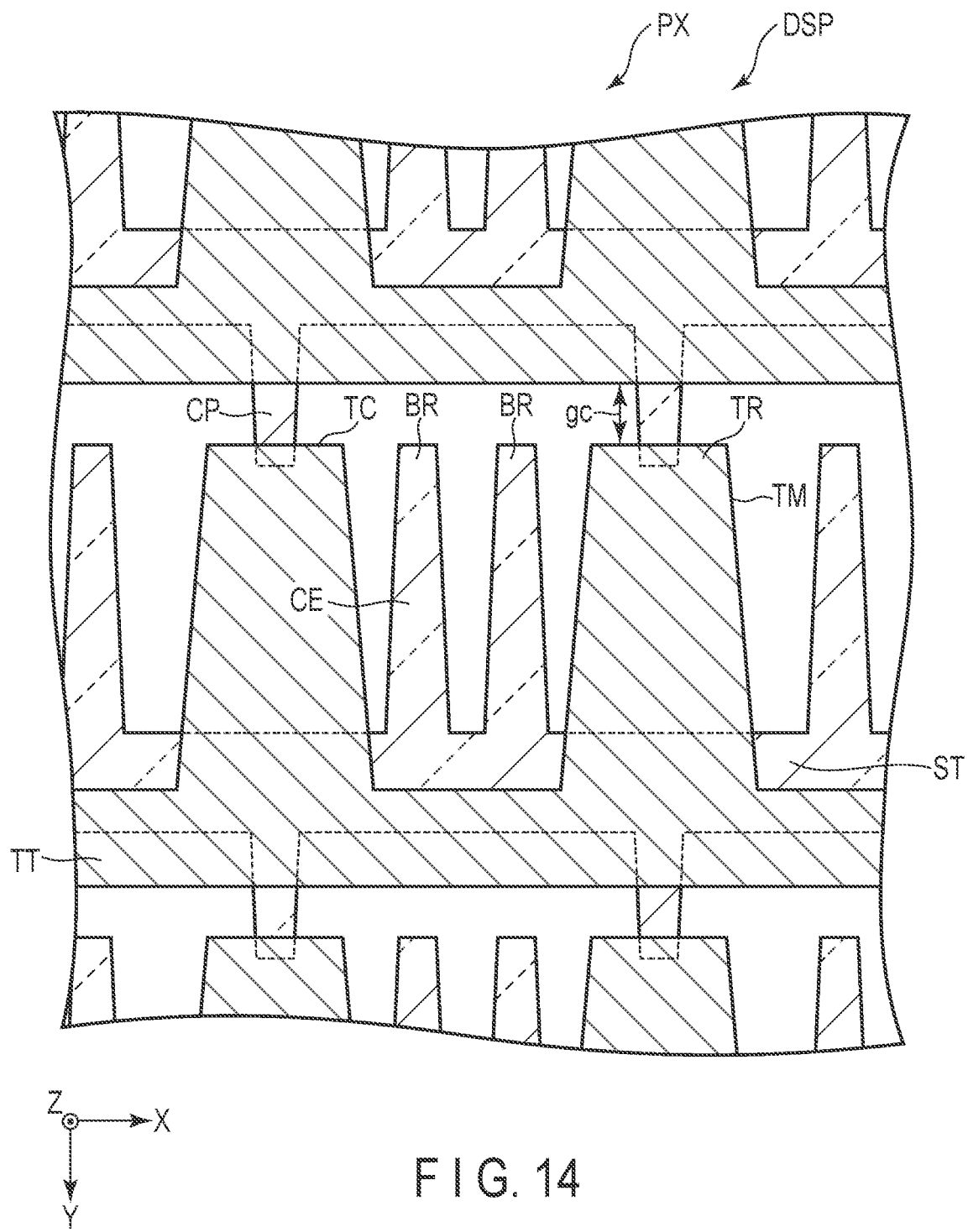
FIG. 14 is a plan view showing the common electrode and wiring lines of the structural elements shown in FIG. 13.
Figure 15:
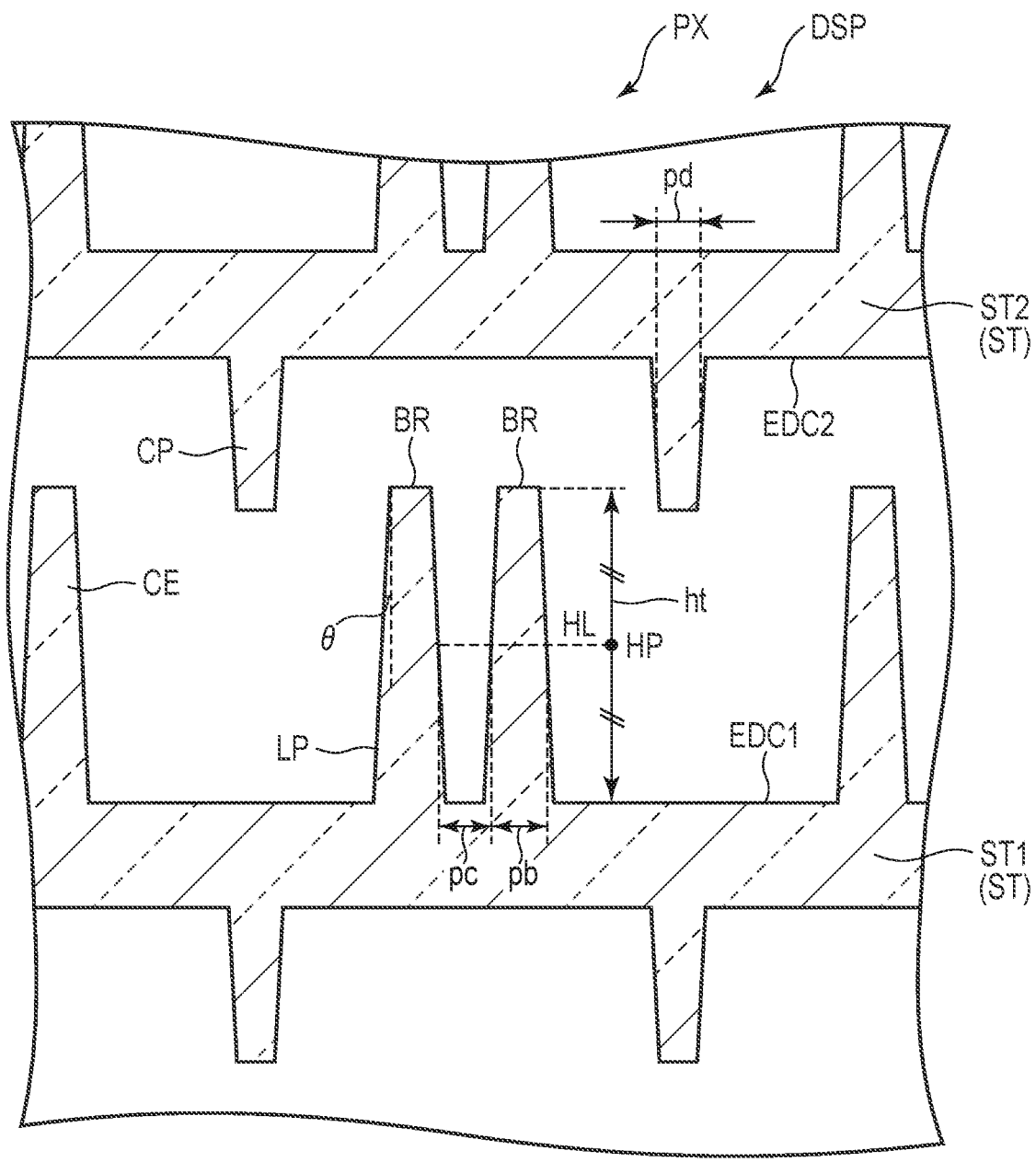
FIG. 15 is a plan view showing only the common electrode among the structural elements shown in FIG. 13.

FIG. 14 is a plan view showing a common electrode CE and wiring lines TM of the structural elements shown in FIG. 13. FIG. 15 is a plan view showing only the common electrode CE of the structural elements shown in FIG. 13.

The common electrode CE includes a stem portion ST extending along the first direction X, a branch portion BR protruding from the stem portion ST and a protruding portion CP extending along the second direction Y and overlapping a part of the respective signal line SL. The stem portion ST, the branch portion BR and the protruding portion CP are formed to be integrated as one body.

The protruding portion CP protrudes in a direction opposite to the extending direction of the branch portion BR. Of the edges of the stem portion ST, edges located along the first direction X are referred to as edges EDC1 and EDC2. Of two stem portions ST adjacent to each other along the second direction Y, one is referred to as a stem portion ST1 and the other is referred to as a stem portion ST2. The branch portions BR extend from the edge EDC1 of the stem portion ST1 towards an upper side of the drawing from a lower side. On the other hand, the protruding portion CP protrudes from the edge EDC2 of the stem portion ST2 towards the lower side of the drawing from the upper side.

The shape of the wiring lines TM shown in FIG. 13 is the same as that of the wiring lines TM shown in FIG. 10. The branch portion TR of each of the wiring lines TM overlaps the distal end of the protruding portion CP in plan view.

With the protruding portion CP of the common electrode CE thus provided, it is possible to shield the voltage applied to the signal line SL. Here, the distance between the end portion TC of the wiring line TM and the stem portion TT is referred to as a distance gc.

As described with reference to FIG. 9, the length pb and the angle θ are obtained in this configuration example as well. In this configuration example, the length pb is the width of the location at a half the height of the branch portions BR. The length pb should preferably be 1.0 µm or more. The angle θ should preferably be 5° or more and 15° or less. The distance gc should preferably be 1.0 µm or more and 1.5 µm or less. Furthermore, here, the length (width) of the protruding portion CP along the first direction X is referred to as a length pd. The length pd should preferably be 1.5 µm or more. In two adjacent branch portions BR provided in the pixel PX, the distance (space) between a point HL of one branch portion BR and a point HL of another branch portion BR is referred to as a distance pc. The distance pc should preferably be 1.8 µm or more.

In this configuration example, the branch portion TR of the wiring line TM is formed to be tapered-down toward its tip, but the shape of the branch portion TR is not limited to this. The length (width) of the branch portion TR along the first direction X may as well be constant.

Further, in this configuration example, the protruding portion CP is formed to be tapered-down, but the shape of the protruding portion CP is not limited to this. The length (width) of the protruding portion CP along the first direction X may as well be constant.

In this configuration example, the protruding portion CP is provided as a part of the common electrode CE, but the configuration thereof is not limited to this. The protruding portion CP may as well be a part of the wiring line TM. Further, both the wiring line TM and the common electrode CE may also have a protruding portion. In such a case, the wiring line TM and the common electrode CE may have the same shape.

This configuration example is described in connection with the structure in which the branch portions BR and TR extend from the lower side of the drawing to the upper side, but the invention is not limited to this structure. The branch portions BR and TR may as well extend from the upper side of the drawing to the lower side, that is, along the second direction Y.

In the above-described case, the protruding portion CP extends from the lower side of the drawing to the upper side, that is, along the direction opposite to the second direction Y.

In this configuration example as well, advantageous effects similar to those of the embodiment can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a plurality of scanning lines extending along a first direction;
a plurality of signal lines extending along a second direction intersecting the first direction;
a plurality of pixels provided at respective intersections of the plurality of signal lines and the plurality of scanning lines;
a plurality of pixel electrodes each provided in a region partitioned by a first scanning line and a second scanning line adjacent to each other of the plurality of scanning lines, and, a first signal line and a second signal line adjacent to each other of the plurality of signal lines;
a common electrode including a stem portion and a plurality of branch portions; and
a third wiring line including a first region overlapping the plurality of scanning lines, and a second region overlapping the plurality of signal lines, wherein
a region in which the pixel electrode and the first scanning line overlap each other is larger than a region in which the pixel electrode and the second scanning line overlap each other,
when a length along a direction intersecting an extending direction of each of the third wiring line and the scanning lines is defined as a width, the width of the first region of the third wiring line is less than the width of the scanning lines, and
the plurality of branch portions of the common electrode extend from the stem portion along the second direction.

2. The display device according to claim 1, wherein each of the plurality of branch portions overlaps two of the pixels, that are adjacent to each other along the first direction.

3. The display device according to claim 1, wherein when a length in a direction intersecting an extending direction of each of the plurality of branch portions is defined as a width, the width of each of the plurality of branch portions at a boundary with the stem portion is greater than the width at a distal end thereof.

4. The display device according to claim 1, wherein when a length along a direction intersecting an extending direction of the signal lines is defined as a width, the width of the second region of the third wiring line is greater than the width of the signal lines.

5. The display device according to claim 1, wherein a length along the second direction by which the pixel electrode and the respective first scanning line overlap each other is greater than a length along the second direction by which the pixel electrode and the respective second scanning line.

6. A display device comprising:
a plurality of scanning lines extending along a first direction;
a plurality of signal lines extending along a second direction intersecting the first direction;
a plurality of pixels provided at respective intersections of the plurality of signal lines and the plurality of scanning lines;
a plurality of pixel electrodes each provided in a region partitioned by a first scanning line and a second scanning line adjacent to each other of the plurality of scanning lines, and, a first signal line and a second signal line adjacent to each other of the plurality of signal lines;

a common electrode including a stem portion, a plurality of first branch portions and a straight portion; and a third wiring line including a second stem portion and a plurality of second branch portions, wherein a region where the pixel electrode and the respective first scanning line overlap each other is larger than a region where the pixel electrode and the respective scanning line overlap each other, the first branch portions of the common electrode extend from the first stem portion along the second direction, the second branch portions of the third wiring line extend from the second stem portion along the second direction, and a width of the second stem portion of the third wiring line is less than a width of the scanning line.

7. The display device according to claim 6, wherein each of the plurality of first branch portions is provided in each respective one of the plurality of pixels.

8. The display device according to claim 6, wherein each of the plurality of first branch portions has a width at a boundary with the first stem portion, that is longer than a width at a distal end thereof.

9. The display device according to claim 6, wherein each of the plurality of second branch portions has a width at a boundary with the second stem portion, that is longer than a width at a distal end thereof.

10. The display device of claim 6, wherein each of the plurality of second branch portions has a constant width at a boundary with the second stem portion.

11. The display device according to claim 6, wherein the signal lines, the straight portion and the second branch portions respectively overlap each other in plan view.

12. The display device according to claim 6, wherein a width of the straight portion is less than a width of the signal line.

13. The display device according to claim 6, wherein the straight portion of the common electrode is provided in a distal end of the second branch of the third wiring line and between second stem portions of third wiring line adjacent to each other along the second direction.

14. A display device comprising:
a plurality of scanning lines extending along a first direction;
a plurality of signal lines extending along a second direction intersecting the first direction;
a plurality of pixels provided at respective intersections of the plurality of signal lines and the plurality of scanning lines;
a plurality of pixel electrodes each provided in a region partitioned by a first scanning line and a second scanning line adjacent to each other of the plurality of scanning lines, and, a first signal line and a second signal line adjacent to each other of the plurality of signal lines;
a common electrode including a stem portion, a plurality of first branch portions and a protruding portion; and
a third wiring line including a second stem portion and a plurality of second branch portions, wherein
a region in which each pixel electrode and the respective first scanning line overlap each other is larger than a region in which each pixel electrode and the respective second scanning line overlap each other, and
a width of the second stem portion of the third wiring is less than a width of the scanning line.

15. The display device of claim 14, wherein two of the first branch portions are provided for each of the plurality of pixels.

16. The display device according to claim 14, wherein each of the plurality of first branch portions has a width at a boundary with the first stem portion, that is greater than a width of a distal end thereof and extends from the first stem portion along the second direction.

17. The display device according to claim 14, wherein each of the plurality of second branch portions has a width at a boundary with the second stem portion, that is greater than a width of a distal end thereof and extends from the second stem portion along the second direction.

18. The display device according to claim 14, wherein each of the plurality of second branch portions has a constant width at a boundary with the second stem portion.

19. The display device according to claim 14, wherein the first branch portions extend from one of two of first stem portions adjacent to each other along the second direction in a direction opposite to the second direction, and the protruding portion protrudes from the other one of the two of the first stem portions along the second direction.

20. The display device according to claim 14, wherein a width of the protruding portion is less than a width of the signal line.

* * * * *